(12) United States Patent
Srinivasan et al.

(10) Patent No.: US 10,698,624 B2
(45) Date of Patent: *Jun. 30, 2020

(54) DATA PROGRAMMING

(71) Applicant: Micron Technology, Inc., Boise, ID (US)

(72) Inventors: Dheeraj Srinivasan, San Jose, CA (US); Ali Mohammadzadeh, Mountain View, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/178,366

(22) Filed: Nov. 1, 2018

(65) Prior Publication Data
US 2019/0065095 A1 Feb. 28, 2019

Related U.S. Application Data

(63) Continuation of application No. 15/621,448, filed on Jun. 13, 2017, now Pat. No. 10,120,604.

(51) Int. Cl.
*G06F 3/06* (2006.01)
*G11C 11/56* (2006.01)
*G11C 16/10* (2006.01)
*G06F 12/02* (2006.01)
*G06F 12/0868* (2016.01)
*G06F 12/0811* (2016.01)

(52) U.S. Cl.
CPC ............ *G06F 3/0638* (2013.01); *G06F 3/061* (2013.01); *G06F 3/0656* (2013.01); *G06F 3/0673* (2013.01); *G06F 12/0246* (2013.01); *G06F 12/0811* (2013.01); *G06F 12/0868* (2013.01); *G11C 11/5628* (2013.01); *G11C 16/10* (2013.01); *G06F 2212/1024* (2013.01); *G06F 2212/214* (2013.01); *G06F 2212/7203* (2013.01); *G06F 2212/7208* (2013.01)

(58) Field of Classification Search
None
See application file for complete search history.

(56) References Cited

U.S. PATENT DOCUMENTS

| | | |
|---|---|---|
| 6,219,276 B1 | 4/2001 | Parker |
| 7,468,912 B2 | 12/2008 | Ho et al. |
| 9,607,691 B1 | 3/2017 | Allegra et al. |
| 2014/0223072 A1 | 8/2014 | Shivashankaraiah et al. |

*Primary Examiner* — Kevin Verbrugge
(74) *Attorney, Agent, or Firm* — Brooks, Cameron & Huebsch, PLLC

(57) ABSTRACT

Apparatuses and methods for performing buffer operations in memory are provided. An example apparatus can include an array of memory cells, a page buffer, and a controller. The page buffer can be configured to store a number of pages of data in respective caches of the page buffer. The controller can be configured to program the number of pages of data to a first group of cells in the array. The programming operation can include programming the first group of cells to target states encoded with respective data patterns. The programming operation can include incrementally releasing a first of the respective caches of the page buffer responsive to completing programming of cells programmed to a particular first one of the target states.

20 Claims, 4 Drawing Sheets

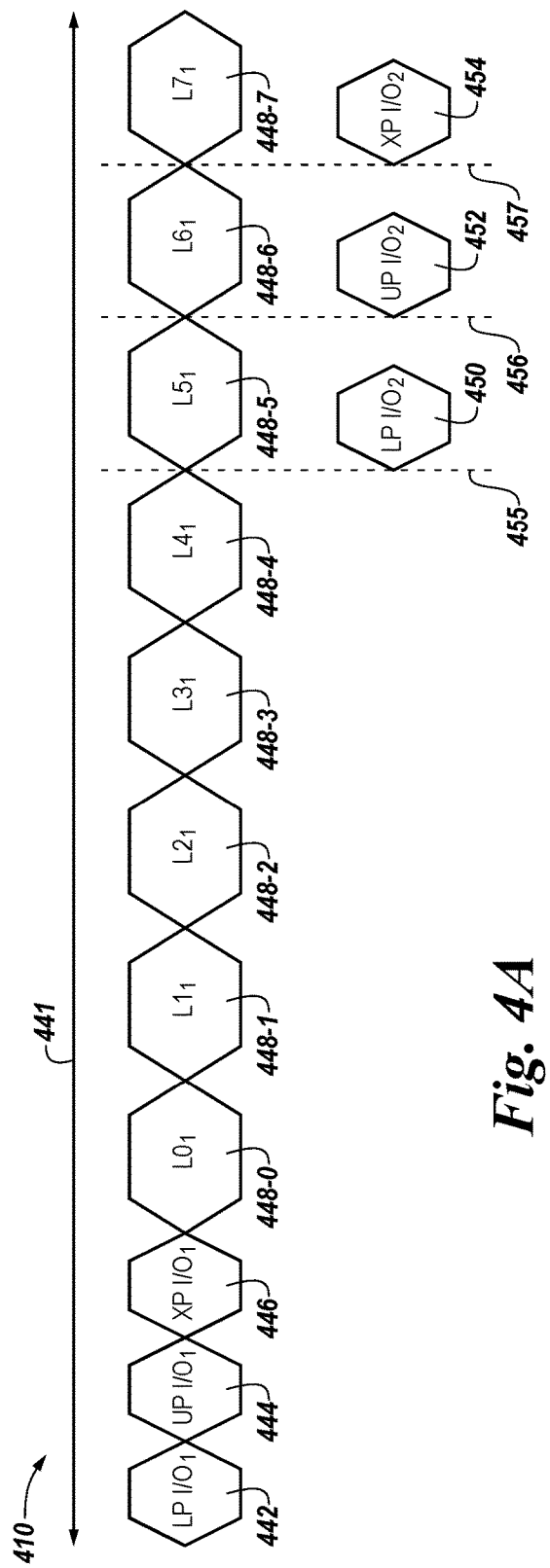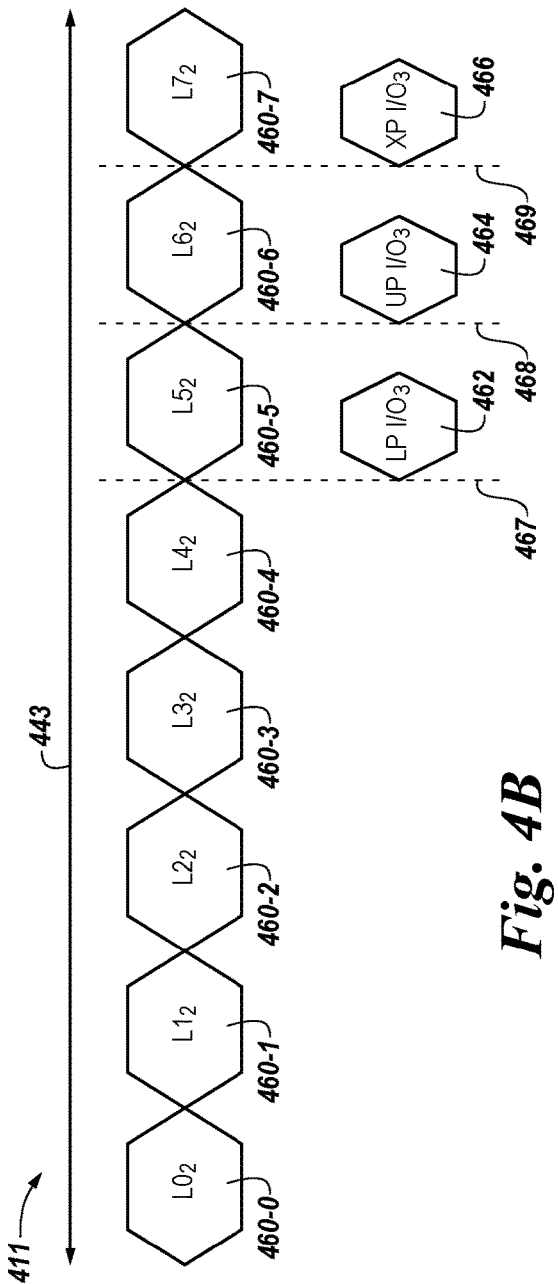

DATA PROGRAMMING

PRIORITY INFORMATION

This application is a Continuation of U.S. application Ser. No. 15/621,448, filed Jun. 13, 2017, which issues as U.S. Pat. No. 10,120,604, on Nov. 6, 2018, the contents of which are included herein by reference.

TECHNICAL FIELD

The present disclosure relates generally to memory devices, and more particularly, to apparatuses and methods for performing data programming in memory.

BACKGROUND

Memory devices are typically provided as internal, semiconductor, integrated circuits in computers or other electronic devices. There are many different types of memory including volatile and non-volatile memory. Volatile memory can require power to maintain its data and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random access memory (RRAM), and magnetoresistive random access memory (MRAM), among others.

Memory devices can be combined together to form a storage volume of a memory system such as a solid state drive (SSD). A solid state drive can include non-volatile memory (e.g., NAND flash memory and NOR flash memory), and/or can include volatile memory (e.g., DRAM and SRAM), among various other types of non-volatile and volatile memory.

In various instances, a single level memory cell (SLC) can refer to a cell programmed to a targeted one of two different data states and configured to store a single data unit (e.g., one bit). Some memory cells (e.g., Flash cells, phase change cells, etc.) can be programmed to a targeted one of more than two different data states such that they are configured to store more than a single data unit (e.g., 2 bits, 2.5 bits, 3 bits, 4 bits, etc.). Such cells may be referred to as multi state memory cells, multiunit cells, multilevel cells, or extra level cells (XLCs). XLCs can provide higher density memories without increasing the number of memory cells since each cell can represent more than one data unit.

Various memory cells experience wear over time due to programming and/or erase cycling, for instance. Memory devices comprising such memory cells can have device specifications such as a total bytes written (TBW) specification and/or a cycle count (e.g., erase count and/or program count) specification, for example, used to gauge a device's health and/or useful life. Some memory cells are capable of being operated (e.g., programed, read, erased, etc.) in both an SLC mode and an XLC mode (e.g., 2-bit "MLC" mode, 3-bit "TLC" mode, 4-bit "QLC" mode, etc.). Such cells can be referred to as "mixed mode" memory cells.

Programming XLC cells can include a data entry phase and a programming phase. The data, such as pages of data, associated with each bit of XLC cells can be entered into a buffer to be programmed to the XLC cells. A period of time can be used to transfer the data to the buffer. The programming of the XLC cells can take a period of time and be delayed by waiting for the data to be entered into the buffer for programming.

BRIEF DESCRIPTION OF THE DRAWINGS

FIG. 4A illustrates a timing diagram associated with data programming in accordance with a number of embodiments of the present disclosure.

FIG. 4B illustrates a timing diagram associated with data programming in accordance with a number of embodiments of the present disclosure.

DETAILED DESCRIPTION

Figure 1:
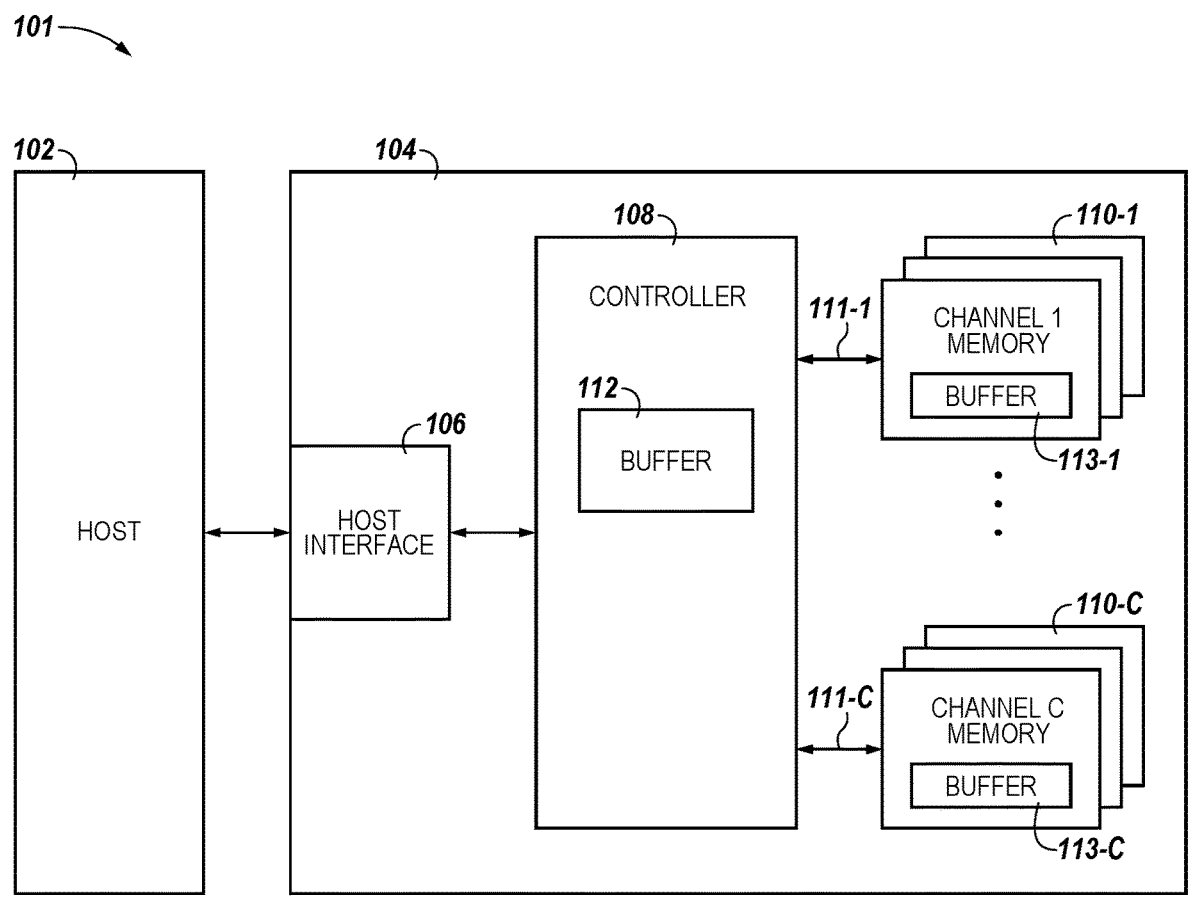
FIG. 1 is a block diagram of an apparatus in the form of a computing system including at least one memory system in accordance with a number of embodiments of the present disclosure.

Apparatuses and methods for data programming are provided. In one or more embodiments of the present disclosure, an example apparatus can include an array of memory cells. The apparatus can include a page buffer configured to store a number of pages of data in respective caches of the page buffer. The apparatus can include a controller coupled to the page buffer and the array and configured to perform a programming operation to program the number of pages of data to a first group of cells in the array. The programming operation can include programming the first group of cells to target states encoded with respective data patterns. The programming operation can include incrementally releasing a first of the respective caches of the page buffer responsive to completing programming of those cells of the first group being programmed to a particular first one of the target states. The programming operation can include incrementally releasing a second of the respective caches of the page buffer responsive to completing programming of those cells of the first group being programmed to a particular second one of the target states.

In some previous approaches, a time delay can occur between a first programming of a first number of pages of cells to a first group of cells (e.g., multiple pages of data being programmed to a single page of data where one cell can represent more than one bit) and a second programming of a second number of pages of cells to a second group of cells. This time delay can be caused by entering data associated with the second number of pages into a page buffer subsequent to completion of the first programming. By entering data associated with the second programming concurrent with performing the first programming, a time delay can be minimized and/or eliminated. For example, a first portion of the cache associated with the first number of pages can be released and data associated with the first of the number of pages of the second programming can be entered into that released first portion while additional programming of cells to target states is occurring.

In the description below, caches storing data associated with each page can be incrementally released as different cells are programmed to a number of target states. As an example, in relation to programming tri-level cells (TLCs), a first portion of a page buffer storing a first page of data (e.g., a first page associated with lower page (LP) data) can be released after completion of programming of cells to a particular target state (e.g., performing a fourth level of programming), a second portion of the page buffer storing a second page of data (e.g., a second page associated with upper page (UP) data) can be released after completion of programming of cells to a second particular target state (e.g., performing a fifth level of programming), and a third portion of the page buffer storing a third page of data (e.g., a third page associated with extra page (XP) data) can be released after completion of programming of cells to a third particular target state (e.g., performing a sixth level of programming).

In this way, a first page of data associated with programming a second set of cells can be entered while the fifth level of programming of the first set of cells to the second particular target state is being performed. A second page of data associated with programming the second set of cells can be entered while the sixth level of programming of the first set of cells is performed. A third page of data associated with programming the second set of cells can be entered while the seventh level of programming of the first set of cells is performed. As the seventh level of programming is completed, the first, second, and third pages of data will be entered as entry of each page of data may take less time than each level of programming. In so doing, performance of a second programming of the second set of cells subsequent to the programming of the first set of cells will not be prohibited by the time it takes to enter data for the second programming.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

The figures herein follow a numbering convention in which the first digit or digits correspond to the drawing figure number and the remaining digits identify an element or component in the drawing. Similar elements or components between different figures may be identified by the use of similar digits. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present disclosure and are not to be used in a limiting sense.

FIG. 1 is a block diagram of an apparatus in the form of a computing system 101 including at least one memory system 104 in accordance with a number of embodiments of the present disclosure. As used herein, a memory system 104, a controller 108, or a memory device 110 might also be separately considered an "apparatus." The memory system 104 can be a solid state drive (SSD), for instance, and can include a host interface 106, a controller 108 (e.g., a processor and/or other control circuitry), and a number of memory devices 110-1, . . . , 110-C (e.g., solid state memory devices such as NAND flash devices), which provide a storage volume for the memory system 104. The memory system 104 can be a single memory device.

As illustrated in FIG. 1, the controller 108 can be coupled to the host interface 106 and to the memory devices 110-1, . . . , 110-C via a plurality of channels, including interfaces 111-1, . . . , 111-C that can include input/output (I/O) lines and/or address/control lines and can be used to send data between the memory system 104 and a host 102. The interfaces 111-1, . . . , 111-C can also be used to send data from the controller 108 to the memory devices 110-1, . . . , 110-C. The interfaces 111-1, . . . , 111-C can be ONFI specification type interfaces. The host interface 106 can be in the form of a standardized interface. For example, when the memory system 104 is used for data storage in a computing system 101, the interface 106 can be a serial advanced technology attachment (SATA), peripheral component interconnect express (PCIe), or a universal serial bus (USB), among other connectors and interfaces. In general, however, interface 106 can provide an interface for passing control, address, data, and other signals between the memory system 104 and a host 102 having compatible receptors for the interface 106. A write operation can be initiated by a write command and the write operation can include a data entry phase where data is transmitted from the controller 108 to caches of the buffers (e.g., page buffers) 113-1, . . . , 113-C via the respective interfaces 111-1, . . . , 111-C. A program operation can be initiated by a program command and can include programming data stored in the buffers 13-1, . . . , 113-C to corresponding cells.

Host 102 can be a host system such as a personal laptop computer, a desktop computer, a digital camera, a mobile telephone, or a memory card reader, among various other types of hosts. Host 102 can include a system motherboard and/or backplane and can include a number of memory access devices (e.g., a number of processors). Host 102 can also be a memory controller, such as where memory system 104 is a memory device (e.g., having an on-die controller).

The controller 108 can communicate with the number of memory devices 110-1, . . . , 110-C (which in some embodiments can be a number of memory arrays on a single die) to control data read, write, and erase operations, among other operations. In some embodiments, the controller 108 can be on the same die or a different die than any or all of the number of memory devices 110.

Although not specifically illustrated, in some embodiments, the controller 108 can include a discrete memory channel controller for each channel coupling the controller 108 to the memory devices 110-1, . . . , 110-C. The controller 108 can include, for example, a number of components in the form of hardware and/or firmware (e.g., one or more integrated circuits) and/or software for controlling access to the number of memory devices 110-1, . . . , 110-C and/or for facilitating data transfer between the host 102 and memory devices 110-1, . . . , 110-C.

As illustrated in FIG. 1, the controller 108 can include a buffer 112. For example, the buffer 112 can include latches or circuitry. The buffer 112 can have discrete components such as an application specific integrated circuit (ASIC) or the components may reflect functionally provided by circuitry within the controller 108 that does not necessarily have a discrete physical form separate from other portions of the controller 108. Although illustrated as components within the controller 108 in FIG. 1, the buffer 112 can be external to the controller 108 or have a number of components located within the controller 108 and a number of components located external to the controller 108.

The number of memory devices 110-1, . . . , 110-C can include a number of arrays of memory cells (e.g., non-volatile memory cells). The arrays can be flash arrays with a NAND architecture, for example. In some examples, the arrays can include a vertical NAND structure or a three-dimensional (3D) NAND structure. However, embodiments are not limited to a particular type of memory array or array architecture. Although floating-gate type flash memory cells in a NAND architecture are generally referred to herein, embodiments are not so limited. The memory cells can be grouped, for instance, into a number of blocks including a number of physical pages. A number of blocks can be included in a plane of memory cells and an array can include a number of planes. As one example, a memory device may be configured to store 8 KB (kilobytes) of user data per page, 128 pages of user data per block, 2048 blocks per plane, and 16 planes per device. The number of memory devices 110-1, . . . , 110-C can also include buffers 113-1, . . . , 113-C (e.g., page buffers). The buffers 113-1, . . . , 113-C can improve write performance of the computing system 101. Write performance is determined by summing program time and data input time. The buffers 113-1, . . . , 113-C can store first page data, second page data, and third page data to respective caches during a first programming operation on a number of memory devices 110-1, . . . , 110-C.

Concurrent with performing a portion of the first programming, a cache associated with a first page of data can be released so that first page data associated with a second programming can be entered into the cache. Concurrent with performing a portion of the first programming, a cache associated with a second page of data can be released so that first page data associated with a second programming can be entered into the cache. Concurrent with performing a portion of the first programming, a cache associated with a third page of data can be released so that third page data associated with a second programming can be entered into the cache. By releasing the respective caches concurrent with performing the first programming, data entry time that may delay a start of a second programming after completion of the first programming can be avoided as the pages of data will have already been entered.

In operation, data can be written to and/or read from memory (e.g., memory devices 110-1, . . . , 110-C of system 104) as a page of data, for example. As such, a page of data can be referred to as a data transfer size of the memory system. Data can be sent to/from a host (e.g., host 102) in data segments referred to as sectors (e.g., host sectors). As such, a sector of data can be referred to as a data transfer size of the host.

According to a number of embodiments of the present disclosure, the controller 108 can be configured to write data to a group of memory cells (e.g., a physical page of memory cells) of a memory array a plurality of times with a respective plurality of discrete write signals each having a different magnitude. The controller 108 (e.g., via respective buffers 113-1, . . . , 113-C) can store first page data, second page data, and third page data during a number of levels of programming. The cached data associated with the first page can be released from the buffer after a particular level of programming while the second page of data and the third page of data are still being programmed. The cached data associated with the second page can be released while the third page of data is still being programmed. Such embodiments can be beneficial to write performance by concurrently performing data input and programming.

Figure 2:
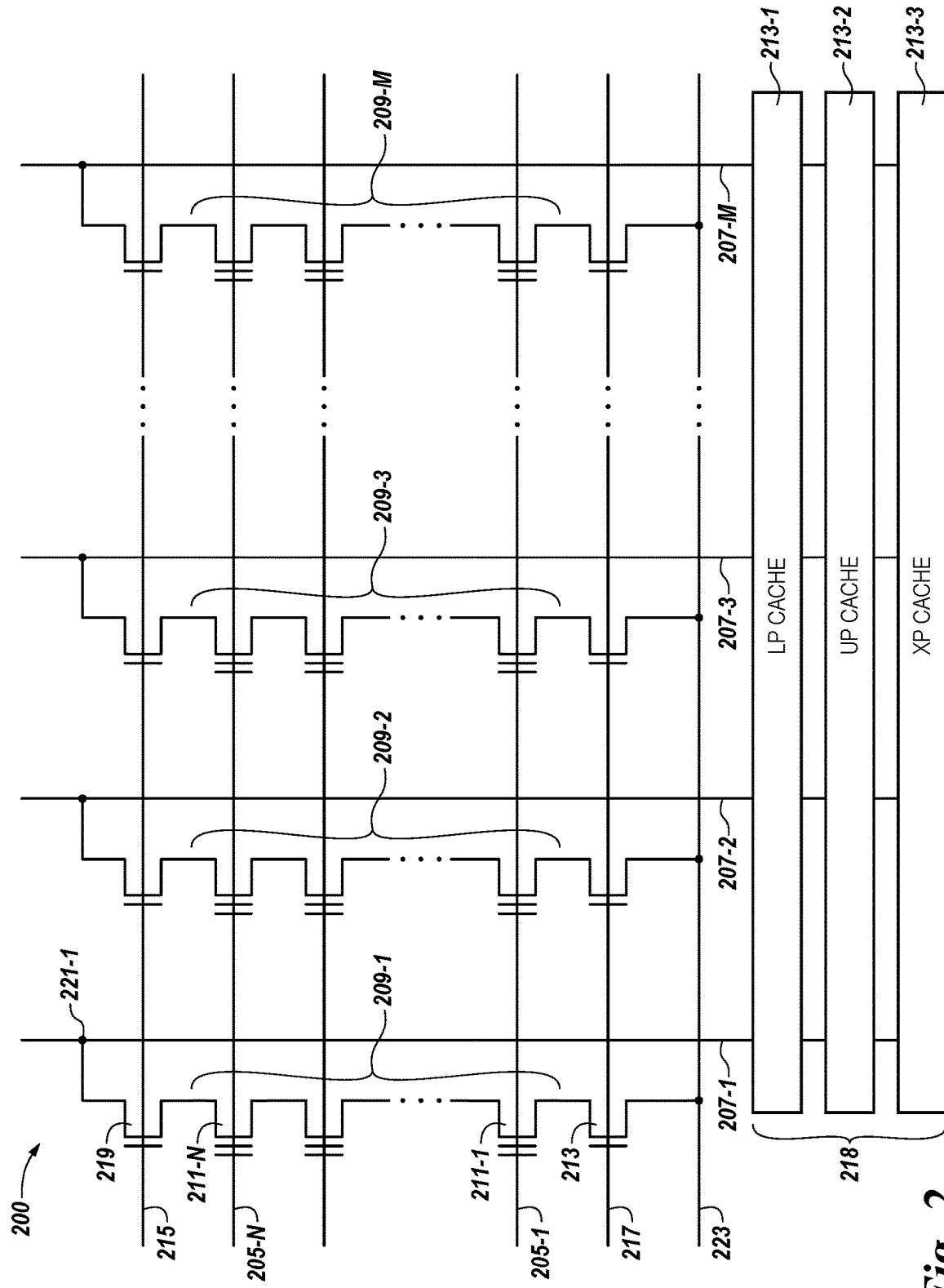
FIG. 2 illustrates a schematic diagram of a portion of a non-volatile memory array in accordance with a number of embodiments of the present disclosure.

FIG. 2 illustrates a schematic diagram of a portion of a non-volatile memory array in accordance with a number of embodiments of the present disclosure. The embodiment of FIG. 2 illustrates a NAND architecture non-volatile memory array. However, embodiments described herein are not limited to this example. As shown in FIG. 2, the memory array 200 includes access lines (e.g., word lines 205-1, . . . , 205-N) and data lines (e.g., bit lines 207-1, 207-2, 207-3, . . . , 207-M). For ease of addressing in the digital environment, the quantity of word lines 205-1, . . . , 205-N and the quantity of bit lines 207-1, 207-2, 207-3, . . . , 207-M can be some power of two (e.g., 256 word lines by 4,096 bit lines).

Memory array 200 includes NAND strings 209-1, 209-2, 209-3, . . . , 209-M. Each NAND string includes non-volatile memory cells 211-1, . . . , 211-N (referred to generally as cells 211), each communicatively coupled to a respective word line 205-1, . . . , 205-N. Each NAND string (and its constituent memory cells) is also associated with a bit line 207-1, 207-2, 207-3, . . . , 207-M. The memory cells 211-1, . . . , 211-N of each NAND string 209-1, 209-2, 209-3, . . . , 209-M are coupled in series source to drain between a source select gate (SGS) (e.g., a field-effect transistor (FET) 213) and a drain select gate (SGD) (e.g., FET 219). Each source select gate 213 is configured to selectively couple a respective NAND string to a common source 223 responsive to a signal on source select line 217, while each drain select gate 219 is configured to selectively couple a respective NAND string to a respective bit line responsive to a signal on drain select line 215.

As shown in the embodiment illustrated in FIG. 2, a source of source select gate 213 is coupled to a common source line 223. The drain of source select gate 213 is coupled to the source of the memory cell 211-1 of the corresponding NAND string 209-1. The drain of drain select gate 219 is coupled to bit line 207-1 of the corresponding NAND string 209-1 at drain contact 221-1. The source of drain select gate 219 is coupled to the drain of the last memory cell 211-N (e.g., a floating-gate transistor) of the corresponding NAND string 209-1.

In a number of embodiments, construction of the non-volatile memory cells 211 includes a source, a drain, a charge storage structure (e.g., a floating gate, charge trap, etc.), and a control gate. The memory cells 211 have their control gates coupled to a word line, 205-1, . . . , 205-N, respectively. A NOR array architecture can be similarly laid out, except that the string of memory cells would be coupled in parallel between the select gates. Furthermore, a NOR architecture can provide for random access to the memory cells in the array (e.g., as opposed to page-based access as with a NAND architecture).

A number (e.g., a subset or all) of cells 211 coupled to a selected word line can be written and/or read together as a group. A number of cells written and/or read together can correspond to a page of cells (e.g., a physical page), and a page of cells can store multiple pages (e.g., logical pages) of data. For example, a cell programmable to one of eight states (e.g., data states) can store three bits of data (e.g., each state can be encoded with a different three bit data pattern) with the three bits corresponding to respective logical pages.

Memory cells 211 can be programmed by applying a number of program pulses (e.g., 16V-20V) to a selected word line in order to increase the threshold voltage (Vt) of selected cells coupled to that selected word line to a particular Vt level corresponding to a targeted state.

The NAND memory devices 110-1, . . . , 110-C described in FIG. 1 may, in a number of embodiments, include NAND dies (e.g., NAND flash arrays) that have single level cells (SLCs) configured to store a single data unit (e.g., one bit), and/or multilevel cells (MLCs) configured to store more than one data unit. Additionally, the cells can be programmable via various different programming processes, which can depend on the quantity of data units stored per cell;

however, cells configured to store a particular quantity of data units (e.g., 2 bits, 3 bits, 4 bits, etc.) per cell can be programmable via different programming processes. For example, a 3-bit MLC might be programmable via a one-pass, two-pass, or three-pass programming process. For example, the 3-bit MLC one-pass programming process can include a single programming pass that places the threshold voltage of the cells from an erase state into one of eight distributions based on lower page, upper page, and extra page data. The 3-bit MLC two-pass programming process can include a 4-8 process in which a first programming pass places the threshold voltage of the cells from an erase state into one of four distributions based on a lower page and upper page data state and in which a second programming pass places the threshold voltage of the cells from the one of four distributions into one of eight distributions based on the extra page data state. The 3-bit MLC three-pass programming process can include a 2-4-8 process, related to the description above.

The quantity of bit lines 207-1, 207-2, 207-3, . . . , 207-M can be coupled to a page buffer 218. The page buffer 218 can include a number of caches including a lower page (LP) cache 213-1, an upper page (UP) cache 213-2, and an extra page (XP) cache 213-3. The LP cache 213-1, UP cache 213-2, and XP cache 213-3 can be configured to store data of respective pages to be programmed to a group of cells in a memory array. Data stored in each of the caches 213-1, 213-2, 213-3 can be released and new data can be entered into the caches 213-1, 213-2, 213-3.

Figure 3:
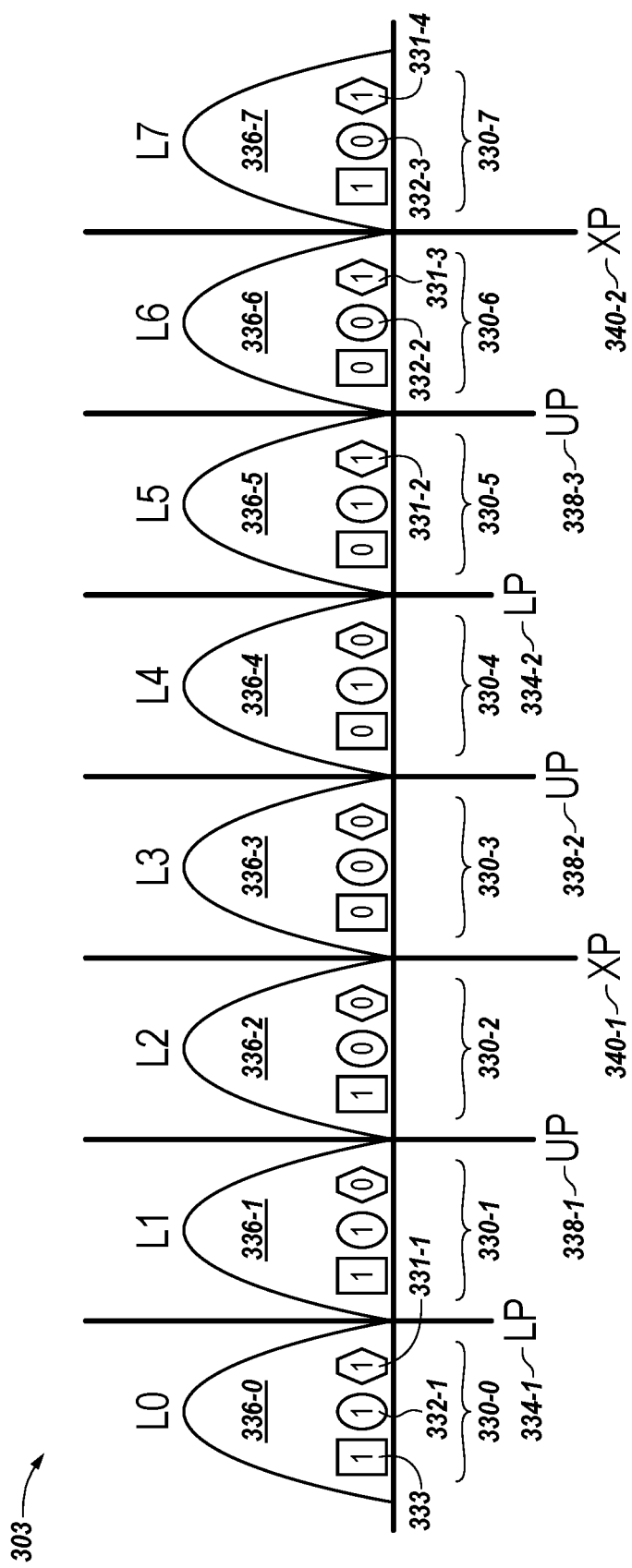
FIG. 3 illustrates a diagram associated with memory cells programmed in accordance with a number of embodiments of the present disclosure.

FIG. 3 illustrates a diagram 303 associated with memory cells programmed in accordance with a number of embodiments of the present disclosure. The example shown in FIG. 3 corresponds to cells programmable to one of eight target states 336-0 (L0) through 336-7 (L7), which are referred to generally as states 336. The states 336 correspond to respective threshold voltage (Vt) levels to which cells can be programmed and are represented by respective Vt distributions, which can reflect statistical average Vt levels of cells programmed to a particular one of states 336. As shown in FIG. 3, the states 336-0 to 336-7 can be encoded with respective data patterns 330-0 to 330-7. In this example, the encoding is a gray code such that adjacent data patterns 330-0 to 330-7 (referred to generally as data patterns 330) differ by a single bit. In a number of embodiments, the bits of stored data patterns 330 correspond to different respective logical pages of data. For instance, in this example, the least significant bit (LSB) 331-1 (designated with a hexagon in each of the data patterns 330) of the data pattern 330-0 corresponds to a first logical page, which can be referred to as a "lower page" (LP), the next bit 332-1 (designated with an oval in each of the data patterns 330) corresponds to a second logical page, which can be referred to as an "upper page" (UP), and the most significant bit (MSB) 333 (designated with a square in each of the data patterns) correspond to a third logical page, which can be referred to as an "extra page" (XP).

State 336-0 can correspond to a lowermost Vt of states 336 and state 336-7 can correspond to an uppermost Vt of states 336. State 336-0 can also be referred to as an "erase state", with memory cells being programmed from an erase state to a target one of states 336 by application of programming pulses to a corresponding selected word line to increase the cells' Vts until Vts corresponding respective target states are reached. The memory cells can be programmed in accordance with various techniques. As an example, a one-pass programming can be employed in which cells coupled to a selected word line are each programmed from the erase state directly to one of the target states 336. Alternatively, the cells can be programmed via a multiple pass programming technique (e.g., two-pass, three-pass, etc.) that can include increasing the Vts of at least some of the cells to one or more intermediate Vt levels (e.g., below the Vt level corresponding to the target state 336) via a first programming pass, and then subsequently increasing cell Vts from the one or more intermediate Vt levels to the target Vt level via one or more subsequent programming passes.

FIG. 3 also illustrates a number of read voltages 334-1, 334-2, 338-1, 338-2, 338-3, 340-1, and 340-2 used to determine (e.g., decode) the programmed states of the memory cells. In this example, two read operations (at 334-1 and 334-2) are used to decode the lower page (LP), three read operations (at 338-1, 338-2 and 338-3) are used to decode the upper page (UP), and two read operations (at 340-1 and 340-2) are used to decode the extra page (XP). However, embodiments are not limited to a particular read algorithm used to distinguish among the programmed states 336.

The gray code, or reflected binary code (RBC) code, of data patterns 330-0 to 330-7 can be used to determine a point in programming between states 336-0 to 336-7 that a particular digit associated with a page does not change. For example, subsequent to programming cells to the state 336-4, the LP digits 331-2, 331-3, 331-4 of each of data patterns 330-5, 330-6, and 330-7 is "1" and therefore additional programming of cells to state 336-5 through state 336-7 does not change the LP digits 331-2, 331-3, 331-4. For this reason, cached data associated with a lower page of data can be released after programming cells to state 336-4 and LP data for a subsequent programming of new data can be entered.

Likewise, subsequent to programming cells to state 336-5, the UP digits 332-2, 332-3 of each of data patterns 330-6 and 330-7 is "0" and therefore additional programming of cells to state 336-6 and state 336-7 does not change the UP digits 332-2, 332-3. The cached data associated with the upper page can be released after programming cells to state 336-5 from the buffer and UP data for the subsequent programming of additional cells with new data can be entered to the cache associated with the upper page. Likewise, subsequent to programming cells to state3 36-6, the XP digit of data patter 330-7 is "1" as there is only programming of cells to state 336-7 left to perform. The cached data associated with the extra page can be released after programming cells to state 336-6 from the buffer associated with the extra page of data and XP data for the subsequent programming of cells with the new data can be entered. In this way, data for a subsequent program (including a new set of programming of L0 to L7 with the new data) can be entered while programming the final levels for the current program of data.

FIG. 4A illustrates a timing diagram associated with data programming in accordance with a number of embodiments of the present disclosure. FIG. 4A illustrates a timing diagram 410 associated with storing a first page, a second page, and third page of data on a buffer and programming the first page, second page, and third page on an array of memory cells. FIG. 4A illustrates the write performance time for a first sequence of data input and programming. The timing diagram 410 of FIG. 4A shows operations for writing data including a lower page data input (LP I/O$_1$ 442, where the "1" indicates an LP I/O of a first sequence), an upper page data input (UP I/O$_1$ 444, of the first sequence), an extra page data input (XP I/O$_1$ 446, of the first sequence), and programming of levels L0$_1$ 448-0 to L7$_1$ 448-7 (of the first sequence). A total time 441 includes total data input (LP, UP, and XP) and programming (L0 to L7). At time 455, the $L4_1$ programming 448-4 can come to completion, the $L5_1$ programming 448-5 can begin, and a cache storing data associated with a lower page can be released. In some examples, a flag can be set when time 455 is reached, indicating that the $L4_1$ programming 448-4 has been completed and cached data associated with a first page (e.g., the lower page) can be released. Further, due to release of the cache storing the lower page data, the LP $I/O_2$ 450 data entry can begin for a second sequence program. In this way, data entry for a next program can be entered concurrent with programming (e.g., L5 programming) for the first sequence.

At time 456, the $L5_1$ programming 448-5 can come to completion, the $L6_1$ programming 448-6 can begin, and a cache storing data associated with an upper page can be released. Further, due to release of the cache associated with the upper page, the UP $I/O_2$ 452 data entry can begin for a second sequence program. In this way, data entry for a next program can be entered concurrent with programming (e.g., L6 programming) for the first sequence. At time 457, the $L6_1$ programming 448-6 can come to completion, the $L7_1$ programming 448-7 can begin, and cached data associated with an extra page can be released. Further, due to release of the cache associated with the extra page, the XP $I/O_2$ 454 data entry can begin for a second sequence program. In this way, data entry for a next program can be entered concurrent with programming (e.g., L7 programming) for the first sequence. In this way, at completion of the first sequence program (at completion of $L7_1$ 448-7), data entry for the subsequent program (e.g., second sequence program) is entered and time delay associated with entering data into the buffer for the next program can be avoided.

In at least one embodiment, a particular cache release sequence can include commands that adhere to the ONFI specifications and are ONFI commands. The ONFI commands can include a sequence of the following:

1) Issue 80h-5Add(LP)-Data-15h to enter LP data for an "8" program
2) Issue 80h-5Add(UP)-Data-15h to enter UP data for an "8" program;
3) Issue 80h-5Add(XP)-Data-15h to enter XP data for an "8" program;
4) Wait for R/B_high (at L4 programming completion);
5) Issue 80h-5Add(LP)-Data-15h to enter LP data for next "8" program;
6) Wait for R/B_high (at L5 programming completion);
7) Issue 80h-5Add(UP)-Data-15h to enter UP data for next "8" program;
8) Wait for R/B_high (at L6 programming completion);
9) Issue 80h-5Add(XP)-Data-15h to enter XP data for next "8" program;
10) Start at 4) Again;

FIG. 4B illustrates timing diagrams associated with data programming in accordance with a number of embodiments of the present disclosure. FIG. 4B illustrates a timing diagram 411 associated with programming a first page, a second page, and a third page of data associated with a program sequence (e.g., second sequence subsequent to the first sequence described in FIG. 4A above) and storing a first page, a second page, and a third page of data on a buffer associated with a subsequent (third sequence) program. FIG. 4B illustrates the write performance time for a second sequence of programming and data input associated with a third sequence of data. The timing diagram 411 of FIG. 4B shows operations for programming of levels $L0_2$ 460-0 to $L7_2$ 460-7 (of the second sequence of data programming). A total time 443 includes programming (L0 to L7 of the second sequence) and data input (LP, UP, and XP of a third sequence). At time 467, the $L4_2$ programming 460-4 can come to completion, the $L5_2$ programming 460-5 can begin, and a cache storing data associated with a lower page can be released. Further, due to release of the cache associated with a lower page, the LP $I/O_3$ 462 data entry can begin for a third sequence program. In this way, data entry for a next program can be entered concurrent with programming (e.g., L5 programming) for the second sequence.

At time 468, the $L5_2$ programming 460-5 can come to completion, the $L6_2$ programming 460-6 can begin, and a cache storing data associated with an upper page can be released. Further, due to release of the cache associated with the upper page, the UP $I/O_3$ 464 data entry can begin for a third sequence program. In this way, data entry for a next program can be entered concurrent with programming (e.g., L6 programming) for the second sequence. At time 469, the $L6_2$ programming 460-6 can come to completion, the $L7_2$ programming 460-7 can begin, and a cache storing data associated with an extra page can be released. Further, due to release of the cache associated with the extra page, the XP $I/O_2$ 454 data entry can begin for a third sequence program. In this way, data entry for a next program can be entered concurrent with programming (e.g., L7 programming) for the second sequence. In this way, at completion of the second sequence program (at completion of $L7_2$ 460-7), data entry for the subsequent program (e.g., third sequence program) is entered and time delay associated with entering data into the buffer for the next program can be avoided. Programming of L0 to L7, in addition to data entry concurrent with the programming, can be repeated for any number of additional sequences.

As illustrated in FIGS. 4A and 4B, the time 441 to complete an initial, first sequence can be greater than the time 443 to complete a subsequent, second sequence. The release of each of the caches associated with pages of data can occur incrementally and in response to bits of data associated with the page of data (e.g., a lower page of data when the cache associated with the LP data is released) the same during subsequent levels of programming. Incremental release of the caches associated with the pages of data can allow for data entry concurrent with programming so that no time delay occurs due to data entry at completion of L0 to L7.

While the examples illustrated above are associated with a tri-level cell (TLC) and are described in association with a particular number of program passes, examples are not so limited. For example, an extra-level cell (XLC), a multi-level cell (MLC), quad-level cell (QLC), etc. can be used to incrementally release caches associated with pages of data based on corresponding gray code and whether data associated with a particular page changes during subsequent programming levels. As an example, a one-pass programming may release cached data associated with a lower page after a fourth level of programming, an upper page of data after a fifth level of programming, and an extra page of data after a sixth level of programming. A two-pass programming may release cached data associated with a lower page after a fifth level of programming, an upper page of data after a sixth level of programming, and an extra level of programming after a seventh level of programming.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure.

It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
an array of memory cells;
a page buffer configured to store a number of pages of data in respective caches of the page buffer; and
a controller coupled to the page buffer and the array and configured to perform a programming operation to program the number of pages of data to a group of cells in the array;
wherein the programming operation comprises:
programming the group of cells to target states encoded with respective data patterns; and
incrementally releasing one of the respective caches of the page buffer responsive to completing programming of those cells of the group associated with the one of the respective caches being programmed to a particular one of the target states.

2. The apparatus of claim 1, wherein the controller is further configured to,
while programming additional cells of the group to an additional target state is occurring,
load, to the one of the respective caches, a first page of multiple pages of data to be programmed to a second group of cells in association with a subsequent programming operation.

3. The apparatus of claim 1, wherein the controller is configured to store lower page data in the first cache.

4. The apparatus of claim 1, wherein the controller is configured to store upper page data in the second cache.

5. The apparatus of claim 1, wherein incrementally releasing comprises releasing a respective cache so that the respective cache can be filled with a page of data being programmed to a second group of cells different than the first group of cells.

6. The apparatus of claim 1, wherein the programming operation comprises incrementally releasing a third of the respective caches of the page buffer responsive to completing programming of those cells of the first group being programmed to a particular third one of the target states.

7. The apparatus of claim 6, wherein the controller is further configured to,
while the programming of those cells of the first group to the particular third one of the target states is occurring, load, to the second cache, a second page of multiple pages of data to be programmed to a second group of cells in association with a subsequent programming operation.

8. The apparatus of claim 6, wherein the controller is configured to store extra page data in the third cache.

9. The apparatus of claim 1, wherein:
the programming operation comprises programming cells of the first group to a particular fourth one of the target data states; and
while the programming of those cells of the first group to the particular fourth one of the target states is occurring, loading, to the third cache, a third page of multiple pages of data to be programmed to a third group of cells in association with a subsequent programming operation.

10. The apparatus of claim 1, wherein the controller configured to program the first group of cells to the particular first and the particular second one of the target states comprises the controller configured to program the first group of cells to a particular first voltage level and a particular second voltage level, respectively.

11. An apparatus, comprising:
an array of memory cells;
a page buffer configured to store a number of pages of data in respective caches of the page buffer; and
a controller coupled to the page buffer and the array and configured to perform a programming operation to program the number of pages of data to a first group of cells in the array;
wherein the programming operation comprises:
programming the first group of cells to target states encoded with respective data patterns; and
responsive to completing programming of those cells of the first group being programmed to a particular one of the target states, releasing a first cache storing one of the number of pages of data.

12. The apparatus of claim 11, wherein the controller is configured to encode the target states with the respective data patterns that are associated with a graycode.

13. The apparatus of claim 12, wherein the controller is configured to implement the graycode associated with the respective data patterns such that, after completion of programming of those cells of the first group of cells to the particular one of the target states, cells of the first group of cells to be programmed are associated with data patterns of a same least significant bit value.

14. The apparatus of claim 13, wherein the controller is configured to implement the graycode associated with the respective data patterns such that, after completion of programming of those cells of the first group of cells to the next particular one of the target states, cells of the first group of cells to be programmed are associated with data patterns of a same second least significant bit value.

15. The apparatus of claim 11, wherein the programming operation comprises:
responsive to completing programming of those cells of the first group being programmed to a next particular one of the target states, releasing a second cache storing another one of the number of pages of data; and
responsive to the programming of those cells of the first group to the next particular one of the target states occurring, loading, to the first cache, a first page of multiple pages of data to be programmed to a second group of cells in association with a subsequent programming operation.

16. The apparatus of claim 15, wherein the programming operation comprises:

responsive to completing programming of those cells of the first group being programmed to a second next particular one of the target states, releasing a third cache storing a second another one of the number of pages of data; and responsive to the programming of those cells of the first group to the second next particular one of the target states occurring, loading, to the second cache, a second page of multiple pages of data to be programmed to a second group of cells in association with a subsequent programming operation.

17. The apparatus of claim 16, wherein the controller is configured to program cells of the first group of cells to a last of the target states prior to programming a second page of multiple pages of data to the second group of cells in association with the subsequent programming operation.

18. A method, comprising:
programming a number of pages of data stored in respective caches of a page buffer to a first group of cells in a memory array, wherein the first group of cells are programmed to target states encoded with respective data patterns;

wherein programming the number of pages to the first group of cells comprises, responsive to completing programming of those cells of the first group being programmed to a particular first one of the target states, releasing a first cache storing a first page of the number of pages of data.

19. The method of claim 18, comprising responsive to completing programming of those cells of the first group being programmed to a particular second one of the target states, releasing a second cache storing a second page of the number of pages of data.

20. The method of claim 19, wherein while the programming of those cells of the first group being programmed to the particular second one of the target states is occurring, loading, to the first cache, a first page of a different number of pages of data to be programmed to a second group of cells in association with programming the different number of pages.

\* \* \* \* \*